US012751256B2

(12) United States Patent
Zhou et al.

(10) Patent No.: US 12,751,256 B2
(45) Date of Patent: Sep. 29, 2026

(54) CHEMICAL MECHANICAL PLANARIZATION POLISHING FOR SHALLOW TRENCH ISOLATION

(71) Applicant: Versum Materials US, LLC, Tempe, AZ (US)

(72) Inventors: Hongjun Zhou, Chandler, AZ (US); Krishna P. Murella, Phoenix, AZ (US); Xiaobo Shi, Chandler, AZ (US); Joseph D. Rose, Gilbert, AZ (US)

(73) Assignee: Versum Materials US LLC, Tempe, AZ (US)

( * ) Notice: Subject to any disclaimer, the term of this patent is extended or adjusted under 35 U.S.C. 154(b) by 243 days.

(21) Appl. No.: 18/696,728

(22) PCT Filed: Sep. 27, 2022

(86) PCT No.: PCT/US2022/077064
§ 371 (c)(1),
(2) Date: Mar. 28, 2024

(87) PCT Pub. No.: WO2023/059999
PCT Pub. Date: Apr. 13, 2023

(65) Prior Publication Data

US 2024/0395558 A1 Nov. 28, 2024

Related U.S. Application Data

(60) Provisional application No. 63/252,425, filed on Oct. 5, 2021.

(51) Int. Cl.
*H10P 95/00* (2026.01)
*C09G 1/02* (2006.01)
*B24B 7/22* (2006.01)

(52) U.S. Cl.
CPC .............. *H10P 95/062* (2026.01); *C09G 1/02* (2013.01); *B24B 7/228* (2013.01)

(58) Field of Classification Search
None
See application file for complete search history.

(56) References Cited

U.S. PATENT DOCUMENTS 6,491,843 B1 12/2002 Srinivasan et al.
6,616,514 B1 9/2003 Edelbach et al.
8,409,990 B2 4/2013 Kraft
9,238,753 B2 1/2016 Reiss et al.
11,649,377 B2 5/2023 Hanano et al.
2008/0045020 A1 2/2008 Kim et al.
2013/0078784 A1 3/2013 Minamihaba et al.
2013/0248756 A1 9/2013 Venkataraman et al.
2016/0160083 A1 6/2016 Lauter et al.
2017/0133236 A1 5/2017 Murella et al.
2018/0002571 A1 1/2018 Stender et al.
2019/0093051 A1 3/2019 Yoshizaki et al.
2021/0324270 A1 * 10/2021 Shi .......................... C09G 1/02
2024/0297049 A1 9/2024 Rose et al.

FOREIGN PATENT DOCUMENTS

CN 105710760 A 6/2016
JP 2009-212378 A 9/2009
JP 2009266882 11/2009
WO 2021081102 A1 4/2021

OTHER PUBLICATIONS

Patent Cooperation Treaty; PCT; International Search Report; International Application No. PCT/US2022/077064; Jan. 27, 2023.
"Extended European Search Report received for European Patent Application No. 22879392.3, mailing date Jul. 14, 2025", 13 Pages.
"International Preliminary Report on Patentability received for PCT Application No. PCT/US2022/077064, mailing date Apr. 18, 2024", 08 Pages.

* cited by examiner

*Primary Examiner* — Roberts P Culbert
(74) *Attorney, Agent, or Firm* — Versum Materials US LLC

(57) ABSTRACT

The present invention discloses Shallow Trench Isolation (STI) Chemical Mechanical Planarization (CMP) polishing compositions, methods and systems that offer high and tunable Oxide: SiN and Oxide: Poly-Si removal selectivity, and low oxide trench dishing at different pH conditions in addition to suppressed Poly-Si removal rates. The polishing compositions comprise abrasive particles such as calcined ceria, and at least two preferably at least three chemical additives. The additives are (1) chemicals such as D-mannose, L-mannose, ribitol (D-ribitol), xylitol, meso-erythritol, D-sorbitol, mannitol, dulcitol, iditol, maltitol, fructose, sorbitan, sucrose, D-ribose, inositol, and glucose; (2) polyacrylic acid or polyacrylate and its ammonium, potassium or sodium salt, and (3) polyethylene glycol (PEG) with different molecular weight distributions as film selectivity tuning and oxide trench dishing reducing additives.

20 Claims, No Drawings

CHEMICAL MECHANICAL PLANARIZATION POLISHING FOR SHALLOW TRENCH ISOLATION

CROSS REFERENCE TO RELATED APPLICATIONS

This application is a national stage application, filed under 35 U.S.C. § 371, of International Patent Application No. PCT/US2022/077064 filed on Sep. 27, 2022, which claims priority to U.S. provisional application 63/252,425 filed on Oct. 5, 2021, the entire content of each is incorporated herein by reference.

BACKGROUND OF THE INVENTION

This invention relates to the chemical mechanical planarization (CMP) for Shallow Trench Isolation (STI) process.

In the fabrication of microelectronics devices, an important step involved is polishing, especially surfaces for chemical-mechanical polishing for the purpose of recovering a selected material and/or planarizing the structure.

For example, a SiN layer is deposited under a $SiO_2$ layer to serve as a polish stop. The role of such polish stop is particularly important in Shallow Trench Isolation (STI) structures. Selectivity is characteristically expressed as the ratio of the oxide polish rate to the nitride polish rate. An example is an increased polishing selectivity ratio of silicon dioxide ($SiO_2$) as compared to silicon nitride (SiN).

In the global planarization of patterned STI structures, reducing oxide trench dishing is a key factor to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

U.S. Pat. No. 6,491,943 discloses the polishing compositions containing abrasive particles which are ceria or titania particles and alpha-amino acids used for Shallow Trench Isolation (STI) polishing applications. The reported examples only listed oxide and SiN removal rates and Oxide: SiN selectivity, no dishing data at all in any of the listed examples.

U.S. Pat. No. 8,409,990 discloses the polishing compositions using ceria particles as abrasives and vanillic acid or proline or isopropyl alcohol as chemical additive(s) used for Shallow Trench Isolation (STI) polishing applications. The reported examples only listed oxide removal rates, no SiN removal rates and dishing data at all in any of the listed examples.

US Patent Application 20130248756A1. teaches the polishing comprising: Ceria particles as abrasives, an amphiphilic non-ionic surfactant wherein the amphiphilic non-ionic surfactant is selected from the group consisting of a water-soluble linear polyoxyalkylene block polymer, a water-soluble branched polyoxyalkylene block copolymer, a water-dispersible linear polyoxyalklene block polymer, and a water-dispersible branched polyoxyalkylene block copolymer. In the reported examples, high selectivity of oxide: poly-Si are listed, but in general, the reported SiN removal rates are still higher than 300 Å/min. and no dishing data at all in any of the listed examples.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

US Patent Application US20160160083A1 teaches the polishing compositions using ceria particles as abrasives, and anionic polymers having a carboxylic acid or phosphoric acid functional groups as additives or using some polyhydroxy organic compounds as additives for STI CMP applications. In the reported examples, oxide, SiN, Poly-Si removal rates and their related selectivity are reported, but no dishing data being reported at all in any of the listed examples.

US Patent Application 20190093051 A1 teaches a surface treatment composition for surface-treating a polished object to be polished which is obtained after polishing with a polishing composition including ceria, polymer additives having carboxyl group or its salts, or polyvalent hydroxy compounds. In the reported examples, no oxide, SiN, Poly-Si removal rates and their related selectivity are reported, and no dishing data being reported at all in any of the listed examples.

However, those prior disclosed Shallow Trench Isolation (STI) polishing compositions did not address the importance of oxide trench dishing reductions.

It should be readily apparent from the foregoing that there remains a need within the art for compositions, methods and systems of chemical mechanical polishing that can afford the reduced oxide trench dishing and improved over polishing window stability in a STI chemical and mechanical polishing (CMP) process, in addition to high removal rate of silicon dioxide as well as high selectivity for silicon dioxide to silicon nitride.

BRIEF SUMMARY OF THE INVENTION

The present invention satisfies the need by providing Chemical mechanical polishing (CMP) compositions for Shallow Trench Isolation (STI) CMP applications. The compositions offer a reduced oxide trench dishing and thus improved over polishing window stability by introducing three chemical additives as oxide trench dishing reducing additives in acidic, neutral and alkaline pH conditions.

The disclosed chemical mechanical polishing (CMP) composition for Shallow Trench Isolation (STI) CMP applications have a unique combination of using inorganic oxide particles, and suitable chemical additives as oxide trench dishing reducing additives.

More specifically, the present invention provides STI CMP compositions using the combinations of three different chemical additives to suppress SiN while supress Poly-Si removal rates, thus to provide the desirable high removal selectivity of Oxide: SiN or Oxide: Poly-Si while offer a reduced oxide trench dishing.

In one aspect, there is provided a STI CMP polishing composition comprises:

abrasive particles;

at least two, preferably at least three different chemical additives;

a solvent; and
optionally
biocide; and
pH adjuster;
wherein
the composition has a pH of 2 to 12, preferably 3 to 10, and more preferably 4 to 9.

The abrasive particles include, but are not limited to inorganic oxide particles, metal oxide-coated inorganic oxide particles, organic polymer particles, metal oxide-coated organic polymer particles, surface modified inorganic oxide particles, and combinations thereof.

The inorganic oxide particles include but are not limited to ceria, calcined ceria, colloidal silica, high purity colloidal silica, fumed silica, colloidal ceria, alumina, titania, and zirconia particles.

An example of calcined ceria particles is calcined ceria particles manufactured from milling process.

The metal oxide-coated inorganic oxide particles include but are not limited to the ceria-coated inorganic oxide particles, such as, ceria-coated colloidal silica, ceria-coated high purity colloidal silica, ceria-coated alumina, ceria-coated titania, ceria-coated zirconia, and any other ceria-coated inorganic oxide particles.

The organic polymer particles include, but are not limited to, polystyrene particles, polyurethane particle, polyacrylate particles, and any other organic polymer particles.

The metal oxide-coated organic polymer particles include, but are not limited to, ceria-coated organic polymer particles, and zirconia-coated organic polymer particles.

The surface modified inorganic oxide particles include, but are not limited to, $SiO_2$—R—$NH_2$, and —SiO—R—$SO_3M$; wherein R can be for example, $(CH2)_n$ group with n ranging from 1 to 12, and M can be for example, sodium, potassium, or ammonium. An example of such surface chemical modified silica particles includes, but is not limited to, Fuso PL-2C from Fuso Chemical Company.

The particle size of the inorganic oxide particles ranges from 10 nm to 500 nm, the preferred particle size ranges from 20 nm to 300 nm, and the more preferred particle size ranges from 50 nm to 250 nm.

The preferred abrasive particles are calcined ceria.

The solvent includes but is not limited to deionized (DI) water, distilled water, and alcoholic solvents.

The at least two, preferably at least three different chemical additives in the combination act together to reduce oxide trench dishing and suppress Poly-Si removal rate, thus increase the removal selectivity of oxide vs Poly-Si.

The first type of the chemical additive includes organic polymers containing at least two or more, preferably four or more, more preferably six or more hydroxyl functional groups in their molecular structures. The first type of the chemical additive functions as an oxide trench dishing reducer.

Some of these chemical additives have a general molecular structure as listed below:

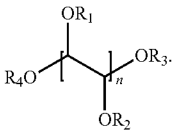

n is selected from 2 to 5,000, the preferred n is from 3 to 12, the more preferred n is from 4 to 7.

$R_1$, $R_2$, $R_3$, and $R_4$ can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four of them are hydrogen atoms.

When $R_1$, $R_2$, $R_3$ and $R_4$ are all hydrogen atoms, the chemical additive bears multi hydroxyl functional groups. The molecular structures of some examples of such chemical additives are listed below:

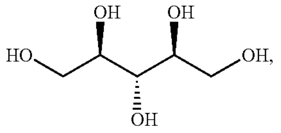

Ribitol

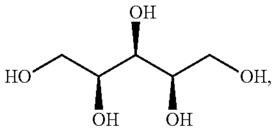

Xylitol

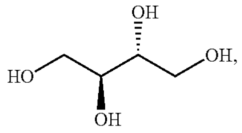

Meso-erythritol

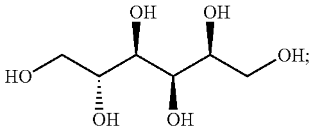

D-sorbitol

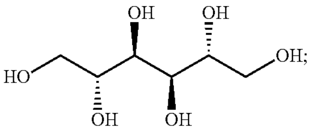

Mannitol

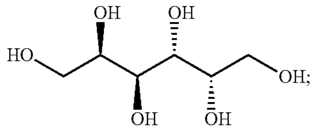

and

Dulcitol

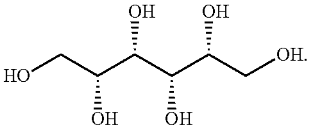

Iditol

The preferred first type of chemical additives include but are not limited to D-mannose, L-mannose, ribitol (D-ribitol), xylitol, meso-erythritol, D-sorbitol, mannitol, dulcitol, iditol, maltitol, fructose, sorbitan, sucrose, D-ribose, and inositol.

The STI CMP slurry contains the first type of chemical additives with concentrations ranging from 0.001 wt. % to 2.0% wt. %, 0.025 wt. % to 1.0 wt. %, or 0.05 wt. % to 0.5 wt. %.

The second type of chemical additives are the organic polymers containing carboxylic acid groups, or their salts.

The second type of the chemical additive functions as an oxide trench dishing reducer.

The organic polymers containing carboxylic acid groups or their salts include but are limited to polyacrylate, polyacrylic acid, and their salts having a general molecular structure as listed below:

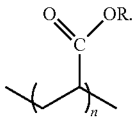

R includes but is not limited to H, an ion includes but is not limited to ammonium, potassium, and sodium ion. n represents the number of the monomer repeating units and can range from 14 to 13889, from 14 to 139, or from 14 to 70. Or the number of n gives a molecular weight of the organic polymer ranging from 1,000 to 1,000,000, from 1,000 to 10,000, or from 1,000 to 5,000.

The STI CMP slurry contains the second type of chemical additives with concentrations ranging from 0.001 wt. % to 2.0% wt. %, 0.005 wt. % to 1.0 wt. %, or 0.01 wt. % to 0.5 wt. %.

The third type of chemical additives are polyethylene glycol (PEG), or copolymers containing PEG. Polyethylene glycol (PEG) is mainly used as Poly-Si removal rate suppressing agents.

The general structure of PEG is listed below:

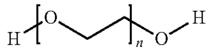

The number of the monomer repeating units n ranges from 4 to 22727 which is corresponding to a PEG molecule having a molecular weight ranging from 200 to 1,000,000.

The STI CMP slurry contains the third type of chemical additives with concentrations ranging from 0.0001 wt. % to 1.0% wt. %, 0.00025 wt. % to 0.5 wt. %, 0.0005 wt. % to 0.1 wt. %, or 0.00075 wt. % to 0.05 wt. %.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In another aspect, there is provided a system for chemical mechanical polishing (CMP) a substrate having at least one surface comprising silicon dioxide using the chemical mechanical polishing (CMP) composition described above in Shallow Trench Isolation (STI) process.

The polished oxide films can be Chemical vapor deposition (CVD), Plasma Enhance CVD (PECVD), High Density Deposition CVD (HDP), or spin on oxide films.

The substrate disclosed above can further comprises at least a surface containing Poly-Si, silicon nitride, or both Poly-Si and silicon nitride. The removal selectivity of $SiO_2$: Poly-Si is greater than 10, preferably greater than 20, and more preferably greater than 30. The removal selectivity of $SiO_2$: SiN is greater than 10, preferably greater than 20, and more preferably greater than 30.

DETAILED DESCRIPTION OF THE INVENTION

This invention relates to the Chemical mechanical polishing (CMP) compositions for Shallow Trench Isolation (STI) CMP applications.

In the global planarization of patterned STI structures, reducing oxide trench dishing is a key factor to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

More specifically, this invention relates to the Chemical mechanical polishing (CMP) compositions for Shallow Trench Isolation (STI) CMP applications which use at least two, preferably at least three different types of chemical additives to tune oxide removal rates, suppress SiN and Poly-Si removal rates to provide high oxide: SiN and high oxide: Poly-Si selectivity, while offer a reduced oxide trench dishing and improving over polishing window stability.

In one aspect, there is provided a STI CMP polishing composition comprises:

abrasive particles;

at least two, preferably at least three different chemical additives;

a solvent; and optionally biocide; and pH adjuster;

wherein the composition has a pH of 2 to 12, preferably 3 to 10, and more preferably 4 to 9.

The abrasive particles include, but are not limited to inorganic oxide particles, metal oxide-coated inorganic oxide particles, organic polymer particles, metal oxide-coated organic polymer particles, surface modified inorganic oxide particles, and combinations thereof.

The inorganic oxide particles include but are not limited to ceria, calcined ceria, colloidal silica, high purity colloidal silica, fumed silica, colloidal ceria, alumina, titania, and zirconia particles.

An example of calcined ceria particles is calcined ceria particles manufactured from milling process.

The metal oxide-coated inorganic oxide particles include but are not limited to the ceria-coated inorganic oxide particles, such as, ceria-coated colloidal silica, ceria-coated high purity colloidal silica, ceria-coated alumina, ceria-coated titania, ceria-coated zirconia, and any other ceria-coated inorganic oxide particles.

The organic polymer particles include, but are not limited to, polystyrene particles, polyurethane particle, polyacrylate particles, and any other organic polymer particles.

The metal oxide-coated organic polymer particles include, but are not limited to, ceria-coated organic polymer particles, and zirconia-coated organic polymer particles.

The surface modified inorganic oxide particles include, but are not limited to, $SiO_2—R—NH_2$, and $—SiO—R—SO_3M$; wherein R can be for example, $(CH2)_n$ group with n ranging from 1 to 12, and M can be for example, sodium, potassium, or ammonium. An example of such surface chemical modified silica particles includes, but is not limited to, Fuso PL-2C from Fuso Chemical Company.

The particles size of the inorganic oxide particles is ranged from 10 nm to 500 nm, the preferred particle size ranges from 20 nm to 300 nm, the more preferred particle size ranges from 50 nm to 250 nm.

The preferred abrasive particles are calcined ceria.

The concentrations of these abrasive particles range from 0.01 wt. % to 20 wt. %, the preferred concentrations range from 0.05 wt. % to 10 wt. %, the more preferred concentrations range from 0.1 wt. % to 5 wt. %.

The solvent includes but is not limited to deionized (DI) water, distilled water, and alcoholic solvents.

The preferred solvent is DI water.

The STI CMP slurry may contain biocide from 0.0001 wt. % to 0.05 wt. %; preferably from 0.0005 wt. % to 0.025 wt. %, and more preferably from 0.001 wt. % to 0.01 wt. %.

The biocide includes, but is not limited to, Kathon™, Kathon™ CG/ICP II, from Dupont/Dow Chemical Co. Bioban or Neolone M10 from Dupont/Dow Chemical Co. They have active ingredients of 5-chloro-2-methyl-4-isothiazolin-3-one and/or 2-methyl-4-isothiazolin-3-one.

The STI CMP slurry may contain a pH adjusting agent.

An acidic or basic pH adjusting agent can be used to adjust the STI polishing compositions to the optimized pH value.

The acidic pH adjusting agents include, but are not limited to nitric acid, hydrochloric acid, sulfuric acid, phosphoric acid, other inorganic or organic acids, and mixtures thereof.

The basic pH adjusting agents include, such as sodium hydroxide, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The STI CMP slurry contains 0 wt. % to 1 wt. %; preferably 0.01 wt. % to 0.5 wt. %; more preferably 0.1 wt. % to 0.25 wt. % pH adjusting agent.

The at least two, preferably at least three different chemical additives in the combination act together to provide the benefits of achieving high oxide film removal rates, suppress Poly-Si and SiN removal rates, high and tunable Oxide: SiN and Oxide: Poly-Si selectivities, and more importantly, significantly reducing oxide trench dishing and improving over polishing window stability.

The first type of the chemical additive includes organic polymers containing at least two or more, preferably four or more, more preferably six or more hydroxyl functional groups in their molecular structures. The first type of the chemical additive functions as an oxide trenching dishing reducer.

Some of the first type of the chemical additive have a general molecular structure as listed below:

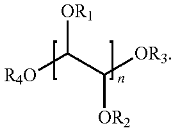

n is selected from 2 to 5,000, the preferred n is from 3 to 12, and the more preferred n is from 4 to 7.

$R_1$, $R_2$, $R_3$, and $R_4$ can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four of them are hydrogen atoms.

When $R_1$, $R_2$, $R_3$ and $R_4$ are all hydrogen atoms, the chemical additive bears multi hydroxyl functional groups. The molecular structures of some examples of such chemical additives are listed below:

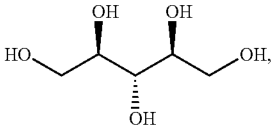

Ribitol

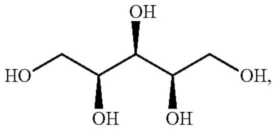

Xylitol

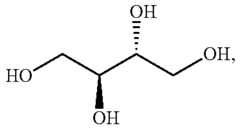

Meso-erythritol

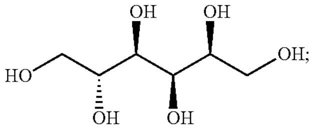

D-sorbitol

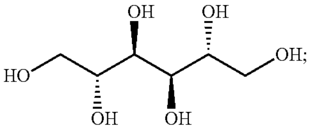

Mannitol

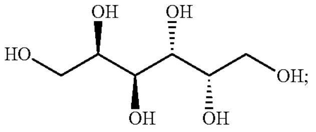

and

Dulcitol

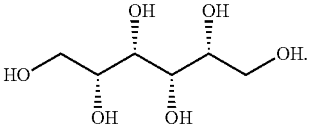

Iditol

The preferred first type of chemical additives include but are not limited to D-mannose, L-mannose, ribitol (D-ribitol), xylitol, meso-erythritol, D-sorbitol, mannitol, dulcitol, iditol, maltitol, fructose, sorbitan, sucrose, D-ribose, and inositol.

The STI CMP slurry contains the first type of chemical additives with concentrations ranging from 0.001 wt. % to 2.0% wt. %, 0.025 wt. % to 1.0 wt. %, or 0.05 wt. % to 0.5 wt. %.

The second type of chemical additives are the organic polymers containing carboxylic acid groups or their salts. The second type of the chemical additive functions as an oxide trenching dishing reducer.

The organic polymers containing carboxylic acid groups or salts include but are limited to the polyacrylic acid, polyacrylate, and their salts having a general molecular structure as listed below:

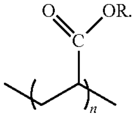

R includes but is not limited to H, an ion includes but is not limited to ammonium, potassium, and sodium ion.

n represents the number of the monomer repeating units and can range from 14 to 13889, from 14 to 139, or from 14 to 70. Or the number of n gives a molecular weight of the organic polymer ranging from 1,000 to 1,000,000, from 1,000 to 10,000, or from 1,000 to 5,000.

The STI CMP slurry contains the second type of chemical additives with concentrations ranging from 0.001 wt. % to 2.0% wt. %, 0.005 wt. % to 1.0 wt. %, or 0.01 wt. % to 0.5 wt. %.

The third type of chemical additives is polyethylene glycol (PEG) or copolymers containing PEG.

Polyethylene glycol (PEG) is mainly used as Poly-Si removal rate suppressing agents.

The general structure of PEG is listed below:

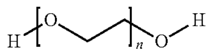

The number of the monomer repeating units n ranges from 4 to 22727 which is corresponding to a PEG molecule having a molecular weight ranging from 200 to 1,000,000.

The STI CMP slurry contains the third type of chemical additives with concentrations ranging from 0.0001 wt. % to 1.0% wt. %, 0.00025 wt. % to 0.5 wt. %, 0.0005 wt. % to 0.1 wt. %, or 0.00075 wt. % to 0.05 wt. %.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In another aspect, there is provided a system for chemical mechanical polishing (CMP) a substrate having at least one surface comprising silicon dioxide using the chemical mechanical polishing (CMP) composition described above in Shallow Trench Isolation (STI) process.

The polished oxide films can be Chemical vapor deposition (CVD), Plasma Enhance CVD (PECVD), High Density Deposition CVD (HDP), or spin on oxide films.

The substrate disclosed above can further comprises at least a surface containing Poly-Si, silicon nitride, or both Poly-Si and silicon nitride. The removal selectivity of $SiO_2$: Poly-Si is greater than 40, preferably greater than 90, and more preferably greater than 200. The removal selectivity of $SiO_2$: SiN is greater than 10, preferably greater than 20, and more preferably greater than 50.

The following non-limiting examples are presented to further illustrate the present invention.

CMP Methodology

In the examples presented below, CMP experiments were run using the procedures and experimental conditions given below.

Glossary

Components

Calcined ceria: used as abrasive having a particle size of approximately 200 nanometers (nm); such calcined ceria particles can have a particle size of ranged from approximately 20 nanometers (nm) to 500 nanometers (nm);

Calcined ceria particles (with varied sizes) were supplied by BJC Inc. in Japan.

Chemical additives, such as maltitol, D-Fructose, Dulcitol, D-sorbitol, polyacrylic acid or polyacrylate or its salts, poly(ethylene glycol) and other chemical raw materials were supplied by Sigma-Aldrich, St. Louis, MO TEOS: tetraethyl orthosilicate Polishing Pad: Polishing pad, IC1010 and other pads were used during CMP, supplied by DOW, Inc.

Parameters

General

Å or A: angstrom(s)—a unit of length

BP: back pressure, in psi units

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: slurry flow, ml/min

Wt. %: weight percentage (of a listed component)

TEOS: SiN Selectivity: (removal rate of TEOS)/(removal rate of SiN)

TEOS: Poly-Si Selectivity: (removal rate of TEOS)/(removal rate of Poly-Si)

HDP: high density plasma deposited TEOS

TEOS or HDP Removal Rates: Measured TEOS or HDP removal rate at a given down pressure. The down pressure of the CMP tool was 3.1 psi in the examples listed below.

SiN Removal Rates: Measured SiN removal rate at a given down pressure. The down pressure of the CMP tool was 3.1 psi in the examples listed.

Poly-Si Removal Rates: Measured SiN removal rate at a given down pressure. The down pressure of the CMP tool was 3.1 psi in the examples listed.

Metrology

Films were measured with a ResMap CDE, model 168, manufactured by Creative Design Engineering, Inc, 20565 Alves Dr., Cupertino, CA, 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, California, 95054. An IC1000 pad supplied by DOW, Inc, 451 Bellevue Rd., Newark, DE 19713 was used on platen 1 for blanket and pattern wafer studies.

The IC1010 pad or other pad was broken in by conditioning the pad for 18 mins. At 7 lbs. down force on the conditioner. To qualify the tool settings and the pad break-in two tungsten monitors and two TEOS monitors were polished with Versum® ST12305 slurry, supplied by Versum Materials Inc. at baseline conditions.

Wafers

Polishing experiments were conducted using PECVD SiN (or SiN), LPCVD SiN; PECVD TEOS (or TEOS) and HDP TEOS (or HDP) wafers. These blanket wafers were purchased from Silicon Valley Microelectronics, 2985 Kifer Rd., Santa Clara, CA 95051.

Polishing Experiments

In blanket wafer studies, oxide blanket wafers, and SiN blanket wafers were polished at baseline conditions.

The tool baseline conditions were: table speed; 93 rpm, head speed: 87 rpm, membrane pressure; 3.1 psi, inter-tube pressure; 3.1 psi, retaining ring pressure; 5.1 psi, slurry flow; 200 ml/min.

The slurry was used in polishing experiments on patterned wafers (MIT864), supplied by SWK Associates, Inc. 2920 Scott Blvd. Santa Clara, CA 95054). These wafers were measured on the Veeco VX300 profiler/AFM instrument.

The 3 different sized pitch structures were used for oxide dishing measurement. The wafer was measured at center, middle, and edge die positions.

TEOS: SiN Selectivity: (removal rate of TEOS)/(removal rate of SiN) obtained from the STI CMP polishing compositions were tunable.

TEOS: Poly-Si Selectivity: (removal rate of TEOS)/(removal rate of Poly-Si) obtained from the STI CMP polishing compositions were tunable.

Calcined ceria were prepared from milling process and purchased from BAIKOWSKI JAPAN CO., LTD. Calcined ceria particles have MPS of about 100 nm measured by dynamic light scattering (DLS).

Polyacrylate ammonium salt having molecular weight ranged from 3,000 to 18,000 were purchased from Kao Chemical Company in Japan.

Polyethylene glycol (PEG) having molecular weight of 1,000 to 8,000 were purchased from Sigma Aldrich of Merck KGaA.

All other reagents and solvents were purchased from Sigma-Aldrich (Merck KGaA) of highest commercial grade and used as received unless otherwise specified.

Working Example 1

In the following working examples, a polishing composition comprising 0.5 wt. % calcined ceria, a biocide ranging from 0.0001 wt. % to 0.05 wt. %, and deionized water was prepared as reference (ref.) at pH 5.35.

The working polishing compositions were prepared by adding different amounts of different additives into the Ref. as shown in Table 1. Polyacrylate ammonium salt (PAA salt) having molecular weight ranged from 3,000 to 18,000 was used as the second type of chemical additive. pH adjusting agent used for acidic pH condition and alkaline pH condition were nitric acid and ammonium hydroxide respectively. All examples had a pH at 5.35.

The polishing compositions were used for polishing TEOS, HDP, SiN and Poly-Si blanket wafers. The film removal rates (RRs) and removal rate (RR) selectivity TEOS: SiN and TEOS: Poly-Si were listed in Table 1.

TABLE 1

Film RR (Å/min.) and TEOS:SiN or TEOS:Poly-Si Selectivity at pH 5.35

| Compositions | TEOS RR (Å/min.) | HDP RR (Å/min.) | SiN RR (Å/min.) | Poly-Si RR (Å/min.) | TEOS:SiN Selectivity | TEOS:Poly-Si Selectivity |
|---|---|---|---|---|---|---|
| Ref. | 3306 | 3099 | 168 | 981 | 20 | 3 |
| Ref. + 0.025% PAA salt | 2024 | 2031 | 79 | 700 | 26 | 3 |
| Ref. + 0.15% D-sorbitol | 2190 | 1798 | 43 | 846 | 51 | 3 |
| Ref. + 0.00125% PEG | 2283 | 2415 | 115 | 662 | 19 | 3 |
| Ref. + 0.025% PAA Salt + 0.15% D-sorbitol | 1812 | 1724 | 93 | 400 | 19 | 5 |
| Ref. + 0.025% PAA Salt + 0.00125% PEG | 2734 | 2739 | 87 | 30 | 31 | 91 |
| Ref. + 0.15% D-sorbitol + 0.00125% PEG | 2309 | 2383 | 58 | 727 | 40 | 3 |
| Ref. + 0.025% PAA Salt + 0.15% D-sorbitol + 0.00125% PEG | 1621 | 1571 | 110 | 4 | 15 | 405 |

As the results showed in Table 1, the working polishing composition containing all three different types of chemical additives (PAA, D-sorbitol, and PEG) and calcined ceria as abrasives, Poly-Si removal rate was significantly suppressed and TEOS: Poly-Si RR selectivity was significantly increased comparing with the compositions containing no chemical additive, one type of chemical additive, or even two types of chemical additives.

The dishing tests were performed using the same compositions on different sized oxide trench. The results were listed in Table 2.

As the oxide trench dishing results shown in Table 2, the working polishing composition provided the lowest oxide trench dishing on 100×100 μm feature while provided low oxide trench dishing on 200×200 μm feature.

The dishing rates on different sized oxide trench were listed in Table 3.

As the oxide trench dishing rate results shown in Table 3, the polishing composition using calcined ceria as abrasives and three different types of chemical additives provided the lowest oxide trench dishing rate on 200×200 μm feature while provided low oxide trench dishing on 100×100 μm feature.

TABLE 2

Effects of Chemical Additives on Oxide Trench Dishing at pH 5.35

| Compositions | 100 μm Trench Dishing (Å) | 200 μm Trench Dishing (Å) |
|---|---|---|
| Ref. | 915 | 1124 |
| Ref. + 0.025% PAA Salt | 268 | 576 |
| Ref. + 0.15% D-sorbitol | 404 | 625 |
| Ref. + 0.00125% PEG | 814 | 1269 |

TABLE 2-continued

Effects of Chemical Additives on Oxide Trench Dishing at pH 5.35

| Compositions | 100 μm Trench Dishing (Å) | 200 μm Trench Dishing (Å) |
|---|---|---|
| Ref. + 0.025% PAA salt + 0.15% D-sorbitol | 219 | 474 |
| Ref. + 0.025% PAA salt + 0.00125% PEG | 274 | 542 |
| Ref. + 0.15% D-sorbitol + 0.00125% PEG | 181 | 311 |
| Ref. + 0.025% PAA salt + 0.15% D-sorbitol + 0.00125% PEG | 150 | 458 |

TABLE 3

Effects of Chemical Additives on Oxide Trench Dishing Rates at pH 5.35

| Compositions | P100 Dishing Rate (Å/sec.) | P200 Dishing Rate (Å/sec.) |
|---|---|---|
| Ref. | 6.54 | 8.8 |
| Ref. + 0.025% Polyacrylate Salt | 2.97 | 6.0 |
| Ref. + 0.15% D-sorbitol | 0.82 | 1.0 |
| Ref. + 0.00125% PEG | 5.88 | 7.9 |
| Ref. + 0.025% PAA salt + 0.15% D-sorbitol | 0.58 | 1.3 |
| Ref. + 0.025% PAA salt + 0.00125% PEG | 2.66 | 4.3 |
| Ref. + 0.15% D-sorbitol + 0.00125% PEG | 1.06 | 1.4 |
| Ref. + 0.025% PAA salt + 0.15% D-sorbitol + 0.00125% PEG | 0.95 | 0.8 |

The effects of using three different types of chemical additives in the polishing composition with calcined ceria as abrasives on P200 Trench, P200 SiN Loss Rates (Å/sec.), and P200 Trench/Blanket Ratio at pH 5.35 were tested (Table 4).

TABLE 4

Effects of Chemical Additives on P200 Trench & P200 SiN Loss Rates(Å/sec.) & P200 Trench/Blanket Ratio at pH 5.35

| Compositions | P200 Trench Loss Rate (Å/sec.) | P200 Trench/ Blanket Ratio | P200 Nitride Loss Rate (Å/sec.) |
|---|---|---|---|
| Ref. | 21.8 | 0.4 | 12.9 |
| Ref. + 0.025% Polyacrylate Salt | 8.1 | 0.2 | 1.7 |
| Ref. + 0.15% D-sorbitol | 2.2 | 0.1 | 1 |
| Ref. + 0.00125% PEG | 22.2 | 0.6 | 11.4 |
| Ref. + 0.025% PAA salt + 0.15% D-sorbitol | 2.6 | 0.1 | 1.3 |
| Ref. + 0.025% PAA salt + 0.00125% PEG | 6.7 | 0.1 | 1.8 |
| Ref. + 0.15% D-sorbitol + 0.00125% PEG | 2.4 | 0.1 | 1 |
| Ref. + 0.025% PAA salt + 0.15% D-sorbitol + 0.00125% PEG | 2.4 | 0.09 | 1.2 |

As the results showed in Table 4, the working polishing composition provided the lowest P200 Trench/Blanket ratio while provided low trench loss rate and nitride loss rate. The low trench loss rate and nitride loss rate typically indicate low oxide trench dishing. The low trench over blanket ratio also indicates low oxide trench dishing. These are in consistent with the results shown in Tables 2 and 3.

Working Example 2

In the following working examples, a polishing composition comprising 0.5 wt. % calcined ceria, a biocide ranging from 0.0001 wt. % to 0.05 wt. %, and deionized water was prepared at pH 6.74 as reference 1 (Ref. 1).

Polishing compositions were used for polishing TEOS, HDP, SiN and Poly-Si blanket wafers. The film removal rates and the selectivity on TEOS: SiN and TEOS: Poly-Si were measured. The results were listed in Table 5.

TABLE 5

Film RR (Å/min.) and TEOS:SiN or TEOS:Poly-Si Selectivity at pH 6.74

| Compositions | TEOS RR (Å/min.) | HDP RR (Å/min.) | PECVD SiN RR (Å/min.) | Poly-Si RR (Å/min.) | TEOS:SiN Selectivity | TEOS:Poly-Si Selectivity |
|---|---|---|---|---|---|---|
| Ref. 1 | 2698 | 2528 | 110 | 723 | 25 | 4 |
| Ref. 1 + 0.025% Polyacrylate Salt | 2136 | 2072 | 31 | 611 | 69 | 3 |
| Ref. 1 + 0.15% D-sorbitol | 1726 | 1711 | 36 | 958 | 48 | 2 |
| Ref. 1 + 0.00125% PEG | 2443 | 2437 | 87 | 51 | 28 | 48 |
| Ref. 1 + 0.025% PAA salt + 0.15% D-sorbitol | 1951 | 1837 | 30 | 759 | 66 | 3 |
| Ref. 1 + 0.025% PAA salt + 0.00125% PEG | 2211 | 2177 | 35 | 40 | 63 | 55 |
| Ref. 1 + 0.15% D-sorbitol + 0.00125% PEG | 1876 | 1899 | 49 | 296 | 38 | 6 |
| Ref. 1 + 0.025% PAA salt + 0.15% D-sorbitol + 0.00125% PEG | 2114 | 1928 | 25 | 19 | 86 | 111 |

As the results showed in Table 5, the working polishing composition provided the highest selectives for both TEOS: SiN and TEOS: Poly-Si comparing with the compositions containing no chemical additive, one or two chemical additives at pH 6.74.

The dishing tests were performed on different sized oxide trench. The results were listed in Table 6.

TABLE 6

Effects of Chemical Additives on Oxide Trench Dishing at pH 6.74

| Compositions | 100 μm Trench Dishing (Å) | 200 μm Trench Dishing (Å) |
|---|---|---|
| Ref. 1 | 939 | 1248 |
| Ref. 1 + 0.025% Polyacrylate Salt | 285 | 538 |
| Ref. 1 + 0.15% D-sorbitol | 261 | 397 |
| Ref. 1 + 0.00125% PEG | 972 | 1282 |
| Ref. 1 + 0.025% PAA salt + 0.15% D-sorbitol | 150 | 345 |
| Ref. 1 + 0.025% PAA salt + 0.00125% PEG | 310 | 714 |
| Ref. 1 + 0.15% D-sorbitol + 0.00125% PEG | 170 | 375 |
| Ref. 1 + 0.025% PAA salt + 0.15% D-sorbitol + 0.00125% PEG | 81 | 224 |

As shown in Table 6, the working polishing composition provided the lowest trench dishing comparing with the compositions containing no chemical additive, one or two chemical additives at pH 6.74.

The effects of using three different types of chemical additives in the polishing composition with calcined ceria as abrasives at pH 6.74 on the different sized oxide trench dishing rates were tested. The results were listed in Table 7.

TABLE 7

Effects of Chemical Additives on Oxide Trench Dishing Rate at pH 6.74

| Compositions | P100 Dishing Rate (Å/sec.) | P200 Dishing Rate (Å/sec.) |
|---|---|---|
| Ref. 1 | 8.54 | 9.8 |
| Ref. 1 + 0.025% Polyacrylate Salt | 1.68 | 2.9 |
| Ref. 1 + 0.15% D-sorbitol | 0.74 | 0.8 |
| Ref. 1 + 0.00125% PEG | 9.08 | 10.5 |
| Ref. 1 + 0.025% PAA salt + 0.15% D-sorbitol | 0.40 | 1.0 |
| Ref. 1 + 0.025% PAA salt + 0.00125% PEG | 3.57 | 6.6 |
| Ref1. + 0.15% D-sorbitol + 0.00125% PEG | 1.11 | 0.9 |
| Ref. 1 + 0.025% PAA salt + 0.15% D-sorbitol + 0.00125% PEG | 0.25 | 0.4 |

As the oxide trench dishing rate results shown in Table 7, the working polishing composition provided the lowest oxide trench dishing rates on both 100×100 μm and 200×200 μm features at pH 6.74.

The effects of using three different types of chemical additives in the polishing composition with calcined ceria as abrasives on P200 Trench, P200 SiN Loss Rates (Å/sec.), and P200 Trench/Blanket Ratio at pH 6.74 were tested. The results were listed in Table 8.

TABLE 8

Effects of Chemical Additives on P200 Trench & P200 SiN Loss Rates(Å/sec.) & P200 Trench/Blanket Ratio at pH 6.74

| Compositions | P200 Trench Loss Rate (Å/sec.) | P200 Trench/ Blanket Ratio | P200 Nitride Loss Rate (Å/sec.) |
|---|---|---|---|
| Ref. 1 | 21.10 | 0.5 | 10.9 |
| Ref1. + 0.025% Polyacrylate Salt | 3.90 | 0.11 | 1.6 |
| Ref. 1 + 0.15% D-sorbitol | 1.70 | 0.06 | 0.8 |
| Ref. 1 + 0.00125% PEG | 22.20 | 0.55 | 11.4 |
| Ref1. + 0.025% PAA salt + 0.15% D-sorbitol | 1.70 | 0.06 | 1.0 |
| Ref. 1 + 0.025% PAA salt + 0.00125% PEG | 8.20 | 0.23 | 1.2 |
| Ref. 1 + 0.15% D-sorbitol + 0.00125% PEG | 2.20 | 0.07 | 0.9 |
| Ref. 1 + 0.025% PAA salt + 0.15% D-sorbitol + 0.00125% PEG | 1.27 | 0.04 | 1.1 |

As the results shown in Table 8, the lowest P200 Trench/Blanket ratio and P200 trench loss rate were obtained with the working polishing composition using calcined ceria as abrasives and three different types of chemical additives at pH 6.74.

As the testing results shown in working example 1 and 2, the STI CMP polishing compositions (working polishing compositions) containing calcined ceria and at least two, preferably at least three different types of chemical additives provided suppressed SiN and Poly-Si and SiN removal rates, increased TEOS: SiN and TEOS: Poly-Si selectivity, while provide low oxide trench dishing.

Working Example 3

In the working example 3, the working polishing compositions comprising 0.5 wt. % calcined ceria, a biocide ranging from 0.0001 wt. % to 0.05 wt. %, the first type of chemical additive PAA salt at 0.025 wt. %, the second type of chemical additive D-sorbitol at 0.15 wt. %, the third type of chemical additive polyethylene glycol (PEG) at 0.00125 wt. % and deionized water were prepared and tested at different pH conditions.

The effects of pH conditions on film removal rates (RRs) and removal rate (RR) selectivity TEOS: PECVD SiN and TEOS: LPCVD SiN were listed in Table 9.

TABLE 9

| Film RR (Å/min.) and Film Selectivity at Different pH Conditions | | | | | | |
|---|---|---|---|---|---|---|
| pH | TEOS-RR (Å/min.) | HDP RR (Å/min.) | PECVD SiN-RR (Å/min.) | LPCVD SiN-RR (Å/min.) | TEOS:PECVD SiN | TEOS:LPCVD SiN |
| 5.35 | 1719 | 1644 | 83 | 54 | 21 | 32 |
| 6 | 1851 | 1768 | 64 | 67 | 29 | 28 |
| 6.74 | 2060 | 1882 | 24 | 57 | 86 | 36 |
| 7.5 | 2082 | 1943 | 21 | 27 | 99 | 77 |
| 8.5 | 2311 | 2152 | 41 | 55 | 56 | 42 |
| 9 | 1809 | 1722 | 22 | 13 | 82 | 139 |

As the results showed in Table 9, starting from pH of 5.35, the working polishing composition provided the high TEOS: SiN selectivities of from 21 and 32 and peaked around 99 (pH 7.5) and 139 (pH 9). Thus, the high TEOS:SiN selectivities spanned at the tested pH range.

The dishing tests were performed at different pH conditions on different sized oxide trench. The results were listed in Table 10.

As shown in Table 10, the working polishing composition provided the low oxide trench dishing on 100 μm and 200 μm features in the pH ranges from 5.35 to 8.5.

When pH condition is at 9.0, both 100 μm and 200 μm features have much worse oxide trench dishing, however, still lower than the oxide trench dishing from the Ref. polishing composition at pH 5.35 as shown in Table 2.

TABLE 10

| Effects of pH Conditions on Oxide Trench Dishing | | |
|---|---|---|
| pH | 100 μm Trench Dishing (Å) | 200 μm Trench Dishing (Å) |
| 5.35 | 134 | 251 |
| 6 | 132 | 301 |
| 6.74 | 145 | 254 |
| 7.5 | 114 | 224 |
| 8.5 | 134 | 289 |
| 9 | 790 | 1032 |

The effects of pH conditions on dishing rates on different sized oxide trench features were listed in Table 11.

TABLE 11

| Effects of pH Conditions on Oxide Trench Dishing Rates | | |
|---|---|---|
| pH | P100 Dishing Rate (Å/sec.) | P200 Dishing Rate (Å/sec.) |
| 5.35 | 0.6 | 0.8 |
| 6 | −0.1 | 0.3 |
| 6.74 | 0.8 | 1.0 |
| 7.5 | 0.4 | 0.8 |
| 8.5 | 0.2 | 0.6 |
| 9 | 7.9 | 10.1 |

As shown in Table 11, the working polishing composition maintained the low oxide trench dishing rates on 100 μm and 200 μm features in the pH ranges from 5.35 to 8.5. When pH condition is at 9.0, both 100 μm and 200 μm features have much high oxide trench dishing rates but much lower than the results from the Ref. polishing composition at pH 5.35 as shown in Table 3.

The effects of pH conditions on P200 Trench, P200 SiN Loss Rates (Å/sec.), and P200 Trench/Blanket Ratio were tested. The results were shown in Table 12.

TABLE 12

| Effects of pH on P200 Trench & P200 SiN Loss Rates(Å/sec.) & P200 Trench/Blanket Ratio | | | |
|---|---|---|---|
| pH | P200 Trench Loss Rate (Å/sec.) | P200 Trench/Blanket Ratio | P200 Nitride Loss Rate (Å/sec.) |
| 5.35 | 1.9 | 0.07 | 1.0 |
| 6 | 1.5 | 0.05 | 1.1 |
| 6.74 | 1.5 | 0.05 | 0.5 |
| 7.5 | 2.1 | 0.07 | 1.1 |
| 8.5 | 1.2 | 0.04 | 0.6 |
| 9 | 20.7 | 0.58 | 10.3 |

As the results shown in Table 12, the working polishing composition maintained the low P200 trench loss rates, low P200 SiN loss rates and low P200 Trench/Blanket Ratios in the pH ranges from 5.35 to 8.5. When pH condition is at 9.0, much high P200 trench loss rates, P200 SiN loss rates and P200 Trench/Blanket Ratios were obtained, but still lower than the results from the Ref. polishing composition at pH 5.35 as shown in Table 4.

The pH testing results shown that using working polishing composition provided desirable oxide film removal rates, low oxide trench dishing, low trench dishing rates and low SiN loss rates at wide pH ranges from 5.35 to 8.5.

Working Example 4

In this example, the polishing composition Ref. 3 was prepared with 0.5 wt. % calcined ceria, a biocide ranging from 0.0001 wt. % to 0.05 wt. %, the first type of chemical additive PAA salt at 0.025 wt. %, the second type of chemical additive D-sorbitol at 0.15 wt. %, the third type of chemical additive polyethylene glycol (PEG) at 0.00125 wt. %, deionized water, and pH of 6.74.

The concentration of PAA salt and polyethylene glycol (PEG) were varied from Ref. 3.

Ref 4 was obtained by increasing PAA salt from 0.025 wt. % to 0.075 wt. % based on Ref. 3; Ref. 5 was obtained by further increasing PEG from 0.00125 wt. % to 0.0025 wt. % based on Ref. 4; Ref. 6 was obtained by further increasing PEG from 0.0025 wt. % to 0.005 wt. % based on Ref. 5; and Ref. 7 was obtained by further increasing PAA salt from 0.075 wt. % to 0.1 wt. % based on Ref. 6; shown in Table 13.

The concentration effects of the first and third types of chemical additives on film removal rates (RRs) and removal rate (RR) selectivity of TEOS: SiN and TEOS: Poly-Si were listed in Table 13.

TABLE 13

Effect of first (PAA salt) and third chemical additives (PEG) on Film RR (Å/min.) and Film Selectivity

| Compositions | TEOS-RR (Å/min.) | HDP RR (Å/min.) | PECVD SiN-RR (Å/min.) | Poly-Si RR (Å/min.) | TEOS:SiN | TEOS:Poly-Si |
|---|---|---|---|---|---|---|
| Ref. 3 | 2068 | 2022 | 33 | 22 | 63 | 94 |
| Ref. 4 (0.075 wt. % PAA Salt) | 2245 | 2181 | 32 | 39 | 70 | 58 |
| Ref. 5 (0.075% PAA Salt, 0.0025% PEG) | 2282 | 2179 | 34 | 38 | 67 | 60 |
| Ref. 6 (0.075% PAA Salt, 0.005% PEG | 2244 | 2105 | 30 | 56 | 75 | 40 |
| Ref. 7 (0.1% PAA Salt, 0.005% PEG | 2271 | 2126 | 33 | 31 | 69 | 73 |

As the results showed in Table 13, within the tested concentration ranges of PAA salt and PEG, the polishing composition consistently provided suppressed Poly-Si RR, and high selectivites of TEOS:SiN and TEOS:Poly-Si comparing with the polishing composition without the use of three chemical additives (Ref. 1) as shown in Table 5.

The dishing tests were performed on different sized oxide trench features. The results were listed in Table 14.

TABLE 14

Effects of Additive Concentrations on Oxide Trench Dishing

| Compositions | 100 μm Trench Dishing (Å) | 200 μm Trench Dishing (Å) |
|---|---|---|
| Ref. 3 | 101 | 225 |
| Ref. 4 | 96 | 245 |
| Ref. 5 | 29 | 142 |
| Ref. 6 | 109 | 201 |
| Ref. 7 | 95 | 200 |

As the results showed in Table 14, within the tested concentration ranges of PAA salt and PEG, the polishing composition consistently provided low trench dishing comparing with the polishing composition without the use of three chemical additives (Ref. 1) as shown in Table 6.

The dishing rates on different sized oxide trench features were tested and results were shown in Table 15.

TABLE 15

Effects of Additive Concentrations on Oxide Trench Dishing Rates

| Compositions | P100 Dishing Rate (Å/sec.) | P200 Dishing Rate (Å/sec.) |
|---|---|---|
| Ref. 3 | 0.96 | 0.94 |
| Ref. 4 | 0.99 | 0.058 |
| Ref. 5 | 0.88 | 0.97 |
| Ref. 6 | 0.89 | 0.69 |
| Ref. 7 | 0.99 | 0.18 |

As the trench dishing rate results showed in Table 15, within the tested concentration ranges of PAA salt and PEG, the polishing composition consistently provided low dishing rates comparing with the polishing composition without the use of three chemical additives (Ref. 1) as shown in Table 7.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical polishing composition comprising:

abrasive particles;

at least three different chemical additives selected from the group consisting of (1) an organic polymer containing at least two or more, four or more, or six or more hydroxyl functional groups in its molecular structure; (2) an organic polymer containing carboxylic acid groups, or its salt; and (3) polyethylene glycol (PEG) or copolymers containing polyethylene glycol (PEG);

solvent;

optionally biocide; and pH adjuster;

wherein the solvent is selected from the group consisting of deionized (DI) water, distilled water, and alcoholic solvents; and the composition has a pH of 2 to 12 or 4 to 9.

2. The chemical mechanical polishing composition of claim 1, wherein the abrasive particles are selected from the group consisting of inorganic oxide particles, metal oxide-coated inorganic oxide particles, organic polymer particles, metal oxide-coated organic polymer particles, surface modified inorganic oxide particles, and combinations thereof.

3. The chemical mechanical polishing composition of claim 1, wherein the abrasive particles are inorganic oxide particles selected from the group consisting of calcined ceria, colloidal silica, alumina, titania, zirconia particles, and combinations thereof.

4. The chemical mechanical polishing composition of claim 1, wherein the organic polymer containing at least two or more, four or more, or six or more hydroxyl functional groups in its molecular structure has a general molecular structure of:

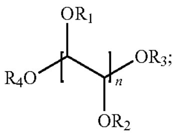

wherein n is selected from 2 to 5,000, or from 3 to 12;

$R_1$, $R_2$, $R_3$, and $R_4$ can be the same or different and each one of them is independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four of them are hydrogen atoms.

5. The chemical mechanical polishing composition of claim 4, wherein $R_1$, $R_2$, $R_3$, and $R_4$, are all hydrogen.

6. The chemical mechanical polishing composition of claim 1, wherein the organic polymer containing at least two or more, four or more, or six or more hydroxyl functional groups in their molecular structure is selected from the group consisting of D-mannose, L-mannose, ribitol (D-ribitol), xylitol, meso-erythritol, D-sorbitol, mannitol, dulcitol, iditol, maltitol, fructose, sorbitan, sucrose, D-ribose, inositol, glucose, and combinations thereof.

7. The chemical mechanical polishing composition of claim 1, wherein the organic polymer containing carboxylic acid groups or its salt has a general molecular structure of

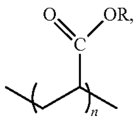

wherein

R is selected from the group consisting of H, and an ion selected from the group consisting of ammonium, potassium, and sodium ion;

n represents the number of the repeating monomer units (1) ranging from 14 to 13889;

from 14 to 139, or ranging from 14 to 70; or (2) giving a molecular weight ranging from 1,000 to 10,000; or from 1,000 to 5,000.

8. The chemical mechanical polishing composition of claim 1, wherein the organic polymer containing carboxylic acid groups or its salt is selected from the group consisting of polyacrylate, polyacrylic acid, polyacrylate ammonium salt, polyacrylate potassium salt, polyacrylate sodium salt, and combinations thereof.

9. The chemical mechanical polishing composition of claim 1, wherein the polyethylene glycol (PEG) or copolymers containing polyethylene glycol (PEG) comprises a general molecular structure of

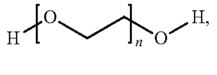

wherein n (1) is from 4 to 22,727; or (2) gives a molecular weight ranging from 200 to 1,000,000.

10. The chemical mechanical polishing composition of claim 1, wherein (1) the organic polymer containing at least two or more, four or more, or six or more hydroxyl functional groups in their molecular structure has a concentration ranging from 0.001 wt. % to 2.0% wt. % or 0.05 wt. % to 0.5 wt. %;

(2) the organic polymers containing carboxylic acid groups or their salt have a concentration ranging from 0.001 wt. % to 2.0% wt. % or 0.01 wt. % to 0.5 wt. %; and (3) the polyethylene glycol (PEG) or copolymers containing polyethylene glycol (PEG) has a concentration ranging from 0.00025 wt. % to 0.5 wt. % or 0.00075 wt. % to 0.05 wt. %.

11. The chemical mechanical polishing composition of claim 1, wherein the composition further comprises from 0.0001 wt. % to 0.05 wt. % or 0.001 wt. % to 0.01 wt. % of the biocide, which has active ingredients of 5-chloro-2-methyl-4-isothiazolin-3-one or 2-methyl-4-isothiazolin-3-one.

12. The chemical mechanical polishing composition of claim 1, wherein the composition further comprises from 0 wt. % to 1 wt. % or 0.01 wt. % to 0.5 wt. % of the pH adjusting agent selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

13. The chemical mechanical polishing composition of claim 1, wherein the composition comprises at least three chemical additives of (1) the chemical additive selected from the group consisting of D-mannose, L-mannose, ribitol (D-ribitol), xylitol, meso-erythritol, D-sorbitol, mannitol, dulcitol, iditol, maltitol, fructose, sorbitan, sucrose, D-ribose, inositol, glucose, and combinations thereof; (2) polyacrylate, polyacrylic acid, polyacrylate ammonium salt, polyacrylate potassium salt, polyacrylate sodium salt, and combinations thereof; and (3) polyethylene glycol; wherein the chemical mechanical polishing composition has a pH of 3 to 10 or 4 to 9.

14. The chemical mechanical polishing composition of claim 1, wherein the composition comprises D-sorbitol, polyacrylate ammonium salt, polyethylene glycol, and the chemical mechanical polishing composition has a pH of 3 to 10 or 4 to 9.

15. A method of chemical mechanical polishing (CMP) a semiconductor substrate having at least one surface comprising a silicon oxide film, comprising providing the semiconductor substrate;

providing a polishing pad;

providing the chemical mechanical polishing (CMP) composition of claim 1;

contacting the at least one surface comprising a silicon oxide film of the semiconductor substrate with the polishing pad and the chemical mechanical polishing composition; and polishing the at least one surface comprising a silicon oxide film.

16. The method of claim 15; wherein the silicon oxide film is selected from the group consisting of Chemical Vapor Deposition (CVD) silicon oxide film, Plasma Enhance CVD (PECVD) silicon oxide film, High Density Deposition CVD (HDP) silicon oxide film, and spin on silicon oxide film.

17. The method of claim 15; wherein the semiconductor substrate further comprises a second surface containing silicon nitride, Poly-Si, or the combination of silicon nitride and Poly-Si, and wherein removal selectivity of $SiO_2$: Poly-Si is greater than 40, preferably greater than 50, and more preferably greater than 100; and removal selectivity of $SiO_2$: SiN is greater than 30, preferably greater than 60, and more preferably greater than 70, when the second surface is polished simultaneously with the at least one surface comprising a silicon oxide film.

18. A system for chemical mechanical polishing (CMP) a semiconductor substrate having at least one surface comprising a silicon oxide film, comprising a. the semiconductor substrate;

b. the chemical mechanical polishing (CMP) composition of claim 1; and c. a polishing pad;

wherein the at least one surface comprising a silicon oxide film is in contact with the polishing pad and the chemical mechanical polishing composition.

19. The system of claim 18; wherein the silicon oxide film is selected from the group consisting of Chemical Vapor Deposition (CVD) silicon oxide film, Plasma Enhance CVD (PECVD) silicon oxide film, High Density Deposition CVD (HDP) silicon oxide film, and spin on silicon oxide film.

20. The system of claim 18; wherein the semiconductor substrate further comprises a second surface containing silicon nitride, Poly-Si, or the combination of silicon nitride and Poly-Si, and wherein removal selectivity of $SiO_2$: Poly-Si is greater than 40, or greater than 100; and removal selectivity of $SiO_2$: SiN is greater than 30, preferably greater than 60, and more preferably greater than 70 when the second surface is polished simultaneously with the at least one surface comprising a silicon oxide film.

* * * * *